United States Patent [19]

Roberts et al.

[11] Patent Number: 5,171,983
[45] Date of Patent: Dec. 15, 1992

[54] RELATIVE POSITION TRANSDUCER FOR OSCILLATING AND SCANNING A READ HEAD OVER A CODED TRACK REGION

[75] Inventors: Teresa M. Roberts, Emsworth; Adrian V. Lewis, Chichester; Graham K. Thornton, Oxford; Jolyon P. Willson, Andover, all of England

[73] Assignee: Schlumberger Industries Limited, Farnborough, England

[21] Appl. No.: 461,880

[22] Filed: Jan. 5, 1990

[30] Foreign Application Priority Data

Jan. 9, 1989 [GB] United Kingdom ............... 8900412

[51] Int. Cl.$^5$ ............................................. G01D 5/34
[52] U.S. Cl. ................................. 250/231.13; 341/13
[58] Field of Search ................... 250/231.13, 231.18, 250/231.17, 237 G; 341/11, 13, 14; 324/175, 173, 174; 231/18

[56] References Cited

U.S. PATENT DOCUMENTS

| | | |
|---|---|---|
| 3,540,040 | 12/1966 | Sheane . |
| 4,628,298 | 12/1986 | Hafle et al. ........................ 341/13 |
| 4,901,073 | 2/1990 | Kibrick ............................. 341/13 |
| 4,970,511 | 11/1990 | Mills ................................. 341/13 |
| 4,990,909 | 2/1991 | Ueda et al. ................. 250/231.17 |

FOREIGN PATENT DOCUMENTS

| | | |
|---|---|---|
| 933013 | 7/1963 | United Kingdom . |
| 1184475 | 3/1970 | United Kingdom . |
| 2185359 | 7/1987 | United Kingdom . |

Primary Examiner—David C. Nelms
Assistant Examiner—T. Davenport
Attorney, Agent, or Firm—Sanford J. Asman

[57] ABSTRACT

A relative position transducer for determining the angular position of a first member angularly movable relative to a second member includes a coded track on the first member, a read head mounted on the second member, drive means for oscillating the read head to scan over and read a limited region of the coded track, and a microcomputer for interpreting the code read by the read head as the position. A first sensor detects when the read head is in a predetermined reference position and a second sensor detects the end points and direction of the read head scan. The sensor outputs are connected to the computer for correct interpretation of the read head output. An interplation is used to improve the accuracy of the position determination.

24 Claims, 7 Drawing Sheets

RELATIVE POSITION TRANSDUCER FOR OSCILLATING AND SCANNING A READ HEAD OVER A CODED TRACK REGION

BACKGROUND OF THE INVENTION (1) Field of the Invention

The present invention relates to apparatus for determining the relative displacement between two relatively movable members.

In particular, the invention relates to an angular displacement transducer, having an output signal dependent on the angular position of a rotary member relative to a fixed member, typically the transducer housing. The output signal is generated even when there is no relative movement between the members.

(2) Description of the Prior Art

In a known transducer, the rotary member is a rotatable disc carrying an angularly coded track. The track is made up of a sequence of light and dark features, forming a binary code. The code on the disc has the property that any group of N adjacent bits is unique, so that by reading N bits of code, the angular position of the disc can be determined. Typically N is of the order of 15 for adequate resolution of the angular position.

An angularly fixed read head is used to read the code on a small area of the disc. The read head comprises N adjacent photosensitive devices, since the position to be determined requires that N bits of code must be read from the disc.

A disadvantage of this type of transducer is that the arrangement, particularly the optical arrangement for reading the N bits of code simultaneously, is complicated and therefore expensive. If more resolution of the angular position is required, more bits of code need to be read, requiring a more complicated and expensive optical read head. Furthermore, if it is desired to bury the angular code in a subcode as is often desirable, even more bits of the coded track will need to be read simultaneously to obtain an angular position determination. This requires an even more complicated, and therefore more expensive, read head.

SUMMARY OF THE INVENTION

An object of the present invention is to provide an angular position transducer which can obtain adequate resolution of angular position, and which is not prohibitively expensive to build.

According to the present invention, there is provided an apparatus as defined in claim 1.

With an apparatus in accordance with the invention, a read head that is capable of reading only a single bit of a binary code on the track, can be used to read a plurality of adjacent bits sequentially.

BRIEF DESCRIPTION OF THE DRAWINGS

An embodiment of the invention will now be described by way of example with reference to the accompanying drawings, in which.

DESCRIPTION OF THE PREFERRED EMBODIMENT

Figure 1:
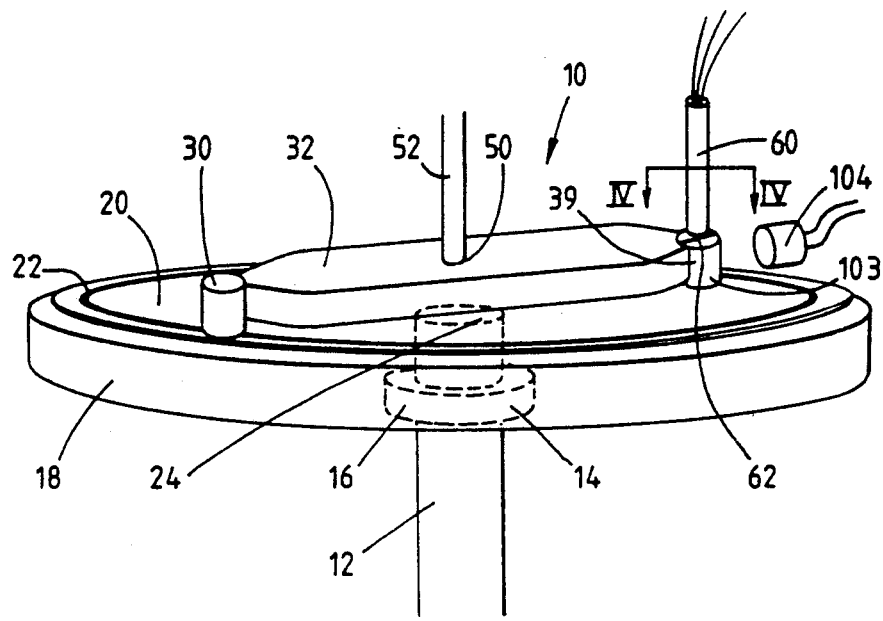
FIG. 1 is a perspective view showing the interior components of an angular displacement transducer.

Referring to FIG. 1, an angular displacement transducer 10 has an input shaft 12. The shaft 12 is rotatably mounted by means of a bearing 14 in a hole 16 in the front plate 18 of the transducer housing. The shaft 12 extends through the hole 16 and is fastened to the centre of a rotatable disc 20 inside the transducer, whereby rotation of the shaft 12 causes corresponding rotation of the disc 20.

The disc 20 is very similar to a conventional compact-disc used to store digital representations of an audio or video signal as an optical binary code. The disc 20 carries a continuous circular track 22 of a sequential pseudo-random binary code a short distance inside the outer edge of the disc 20. The code is represented on the disc as a sequence of binary features, defined on the track by areas of reflective and non-reflective material. A reflective area corresponds to a logical 1, and a non-reflective area corresponds to a logical 0. The pseudo-random code has the property that any set of 15 adjacent bits of the data code is unique, so that by reading a portion of 15 bits of the data code, the angular position of the disc 20 can be determined relative to a predetermined reference position.

The disc 20 can be manufactured by a similar method to that used to manufacture conventional compact discs by copying a master or prototype disc. The prototype disc 20 can be made from a square of a low expansion glass substrate. The glass is initially covered by a layer of evaporated chrome, which is highly optically reflective and which is covered in turn by a photoresist. The photoresist is then selectively removed using a laser, so as to leave the desired bit pattern covered and to expose the chrome around the bit pattern. In the bit pattern, the chrome is left covered wherever a logical 1 is to appear in the coded hack. The exposed chrome is then chemically etched away, and finally the remaining photoresist is removed to expose the chrome bit pattern. The square of glass substrate is then cut to form a disc, and a hole is formed in the centre for the end 24 of the shaft 12 to pass through.

The size of the disc is determined by the width of each feature on the coded track, and the resolution of the angular displacement measurement required for the transducer. In the preferred embodiment, the width of each feature on the disc is approximately 1.9 um. The number of data bits of code read to determine the angular displacement is 15, and each data bit is represented on the disc as a sequence of three features. The code of 15 consecutives 0's is not used, so that the number of angular positions available by reading 15 bits of binary code is $2^{15}-1$, or 32767. The total number of features on the track is therefore $32767 \times 3 = 98301$.

A disc of around 60 mm in diameter is sufficient to carry the track.

If the size of each feature were reduced to 1 um, the diameter of the disc could be reduced to approximately 33 mm.

An optical read head 30 is mounted on a support assembly 32 above the disc 20 to read a region of the coded track 22. The support assembly 32 contains magnetic coils (not shown) for controlling the height of the read head 30 above the surface of the disc 20. These coils are controlled by an autofocus mechanism described hereinafter.

Figure 2:
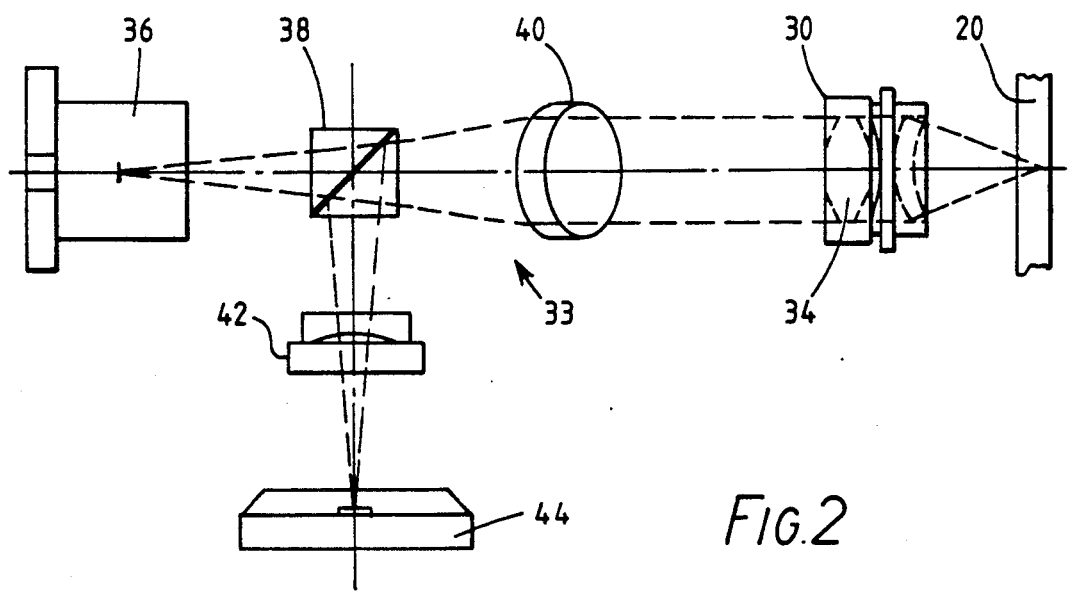
FIG. 2 is a diagrammatic view showing the optical pick-up used in the angular displacement transducer of FIG. 1.

The read head 30 contains an objective lens 34 and is part of an optical pick-up 33 shown in FIG. 2. Referring to FIG. 2, the optical pick-up 33 also includes a semiconductor laser diode 36, a polarised beam splitter/quarter wavelength plate 38, a collimating lens 40, a cylindrical lens 42 and a four quadrant photosensitive diode 44. The read head 30, the support assembly 32, and the optical pick-up 33 are all similar to the equivalent components used in a conventional compact-disc reading mechanism.

In use, light emitted by the laser diode 36 passes through the polarised beam splitter 38, and through the collimating lens 40, from which it emerges as substantially parallel light. The light is then focused by the objective lens 34 in the read head 30 to illuminate a small area on the surface of the disc 20. The autofocus mechanism described hereinafter is sufficiently accurate to ensure that the light is focused to an area no wider than the width of a feature on the track, i.e. 1.9 um.

If the feature is a logical 1, the light illuminates an area of reflective chrome and is reflected back along its original path through the objective lens 34, through the collimating lens 40 to the polarised beam splitter 38. The light is there reflected through 90° to pass through the cylindrical lens 42, and forms an illuminated image on the photosensitive diode 44. The diode 44 gives a "light" output indicative of a logical 1 feature being read from the coded track 22.

If the feature is a logical 0, the light illuminates a non reflective area where the chrome has been removed, and largely passes through the disc with little reflection. Virtually no light is reflected back through the optical pick-up 33 to the photosensitive diode 44. The diode 44 gives a "dark" output indicative of a logical 0 feature being read from the coded track 22.

Figure 3:
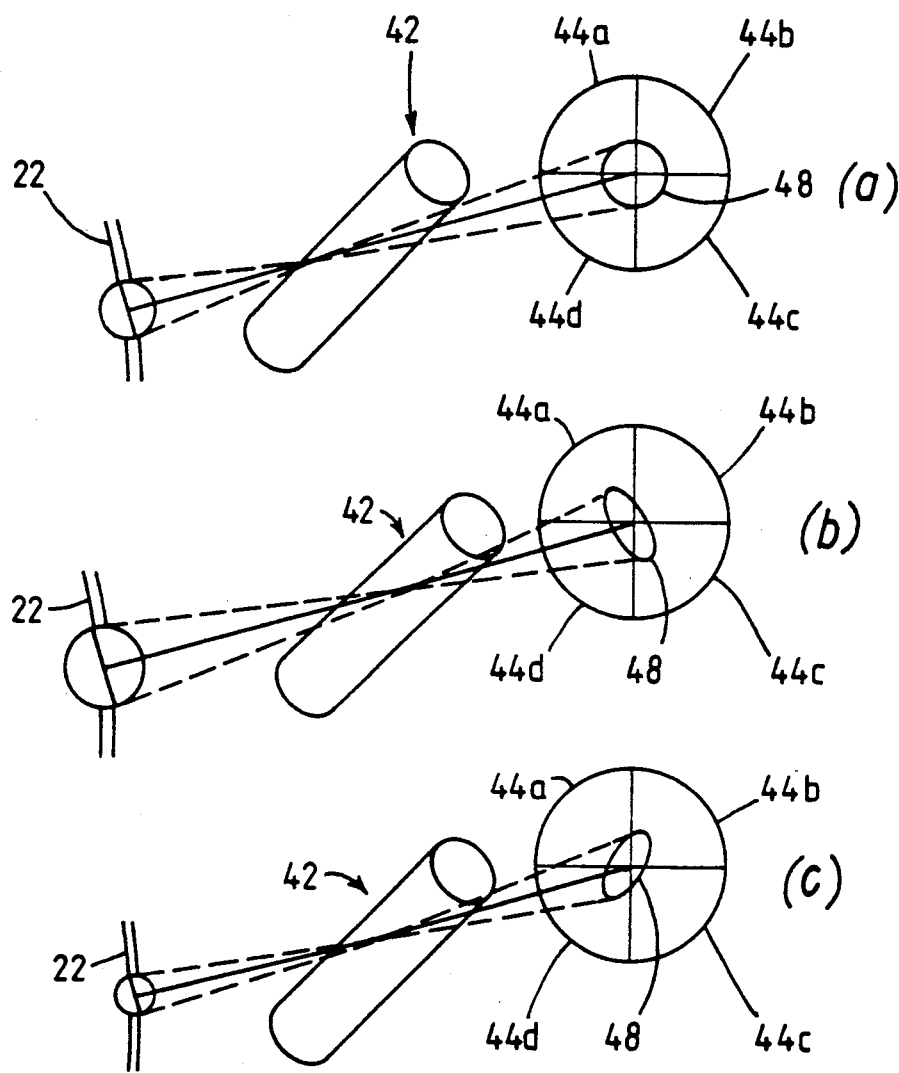
FIG. 3a, b and c is a series of diagrams showing operation of an autofocus control.

As there are deviations even in the flattest of discs the objective lens 34 must be able to refocus as the disc surface deviates. An autofocus mechanism is therefore required to continuously monitor the focusing. To generate a correction signal, the cylindrical lens 42 just prior to the photodiode 44 is used. Referring to FIGS. 3a,b,c, as the distance between the objective lens 34 and the disc 20 varies, the focal point of the system changes and the image 48 projected by the cylindrical lens changes shape. The change in the image on the photodiodes generates the focus correction signal. The objective lens needs to be moved until the signal on the four quadrant photodiode gives a circle as shown in FIG. 3a. The signals from the photodiodes 44a,b,c and d are then equal. In FIG. 3b, the lens 34 is too near the disc 20, and the focal point is displaced from its focused position, causing the image 48 formed on the photodiodes 44 to be an ellipse. The output signal from the quadrant diodes 44a and 44c is greater than those from the quadrant diodes 44b and 44d.

In FIG. 3c, the lens 34 is too far from the disc 20, and the focal point is displaced in the opposite direction, causing the image formed on the photodiodes 44 to be another ellipse, rotated through 90°. The output signal from the quadrant diodes 44b and 44d is therefore greater than those from the quadrant diodes 44a and 44c.

The difference in signal from the photodiodes is used to continually correct the mechanism until a zero difference signal is obtained i.e. the laser beam is focused.

The objective lens is displaced in the direction of the optical axis by a coil and permanent magnet structure. Control voltages from the focus drive circuit are applied to the focus coil and it moves up and down with respect to the magnet. There will be a maximum reaction time T in which the correct focusing will always be achieved.

The autofocus of the read head is being used as designed for the C.D. player. The autofocus mechanism is only operative when light is being reflected onto the photodiode 44.

A scanning mechanism is provided to scan the read head 30 over a region of the coded track 22, allowing it to read sequentially the features contained in the region, sufficient to read at least 15 bits. By scanning, a sufficient number of features can be read to enable the angular position of the disc 20 to be determined, even though the head 30 can itself only read one feature at any one moment, and the disc 20 may be stationary.

Referring to FIG. 1, in the preferred embodiment, the support assembly 32 is attached to one end 50 of a torsion bar 52. The other end (not shown) of the torsion bar 52 is fixed relative to the transducer housing. The scanning is achieved by forcing the read head 30, its support assembly 32 and the torsion bar 52 to oscillate at the resonant frequency of the torsion bar. The oscillation causes the read head to move back and forth circumferentially along the region of the track 22. The oscillations are excited by means of a magnet and an electromagnetic coil (not shown). The coil generates a circular magnetic field in a plane perpendicular to the axis of the torsion bar 52. The coil is attached to the read head 30, and the magnet is fixed relative to the transducer housing. The magnet and coil are equivalent to those used in a conventional compact disc reading mechanism for controlling radial movement of the read head.

The resonant frequency of oscillation is in the range 50 Hz to 250 Hz, and is typically 100 Hz. This frequency of oscillation is chosen so that the maximum scan velocity gives a minimum read time period per feature which is greater than the focusing reaction time T of the autofocus mechanism.

As explained hereinabove, 15 bits of data code need to be read to determine a unique angular position, and each bit of data is represented on the track 22 as a sequence of 3 features. The width of each feature on the track 22 is 1.9 um Therefore, to enable an angular position to be determined, the minimum scan distance must be $15 \times 3 \times 1.9$ um = 85.5 um. The actual scan distance used is approximately 110 um. This provides about 20% overscan to reduce the chances of an erroneous reading from missing data bits near the end points of the scan. The number of data bits read during the overall scan is approximately 19.

To enable the stream of output from the read head to be interpreted correctly, two reference sensors are provided.

The first sensor detects the end points of the oscillatory travel of the read head and the direction of scan. This allows the data read in one direction of scan to be separated from data read in the opposite direction in the next scan.

A magnetic pick-up probe 104 is used for the first sensor.

A magnet 103 is fixed as a counterweight for the read head. The magnetic pick-up remains fixed and measures the rate of change of magnetic flux as the magnet approaches and moves away from the probe. Referring to FIG. 9a, the displacement of the read head during its oscillations about a mean point will be approximately a sinewave, which is approximately linear between the displacement positions shown as 'A' and 'B'. Data bits are only read from the disc during the linear region of the scan. Referring to FIG. 9b, the corresponding output from the pick-up will be a sinewave which is 90° out of phase with the displacement of the read head. During the linear region in one direction of the read head scan, the output from the pick-up is above a threshold 'C', and during the linear region in the opposite direction of scan, the output is below a threshold 'D'. Comparators are chosen accordingly to detect when the output exceeds the thresholds 'C' and 'D', thereby determining the end points of the scan and the scan direction. This is essential because, as explained hereinafter for an anticlockwise scan the code needs to be inverted and interpreted in reverse.

The output from the magnetic pick-up is also applied in a positive feedback manner to the scanning drive magnetic coils, to maintain resonant oscillation of the support assembly and the torsion bar.

The second sensor detects when the head is in a predetermined reference position relative to the transducer housing. This enables the 19 bits of data read during a scan to be aligned so that the correct 15 bits are selected for the angular position reading.

Referring to FIG. 1, an optical probe 60 is fixed relative to the transducer housing, and is directed to detect the presence of an optical reference mark 62. The reference mark 62 is mounted on the counterweight 39 which moves back and forth with the oscillatory scanning.

Figure 4:
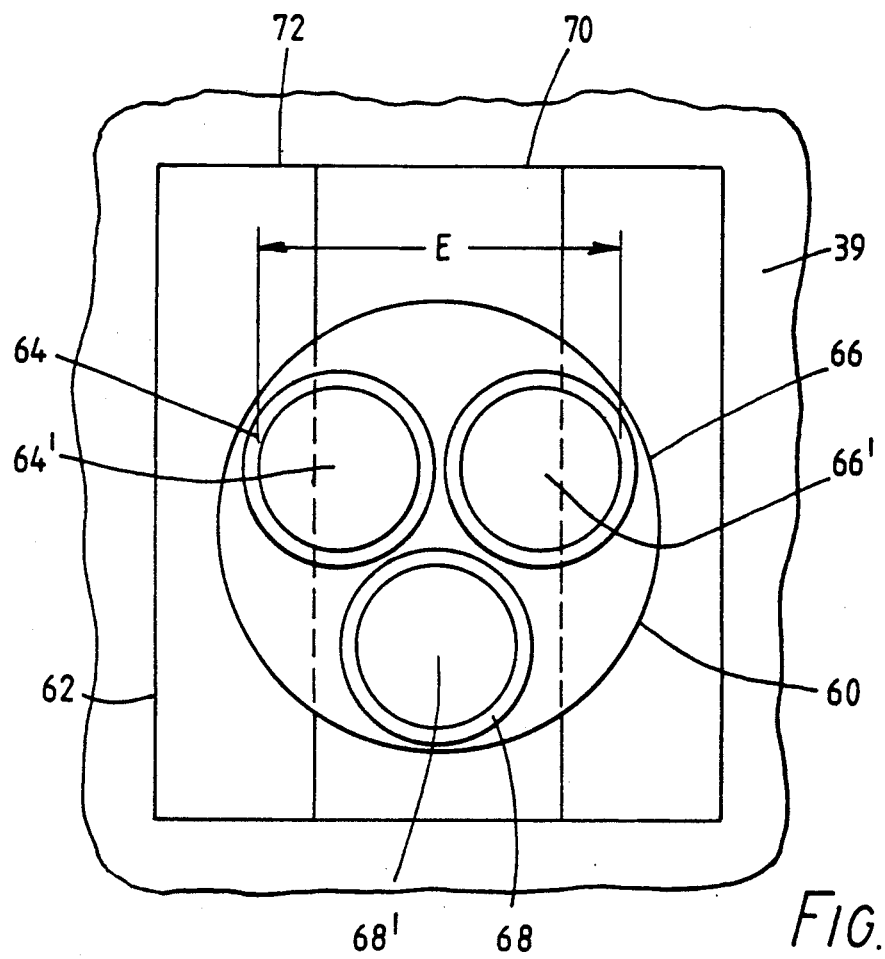
FIG. 4 is a section along the line IV—IV of FIG. 1.
Figure 5:
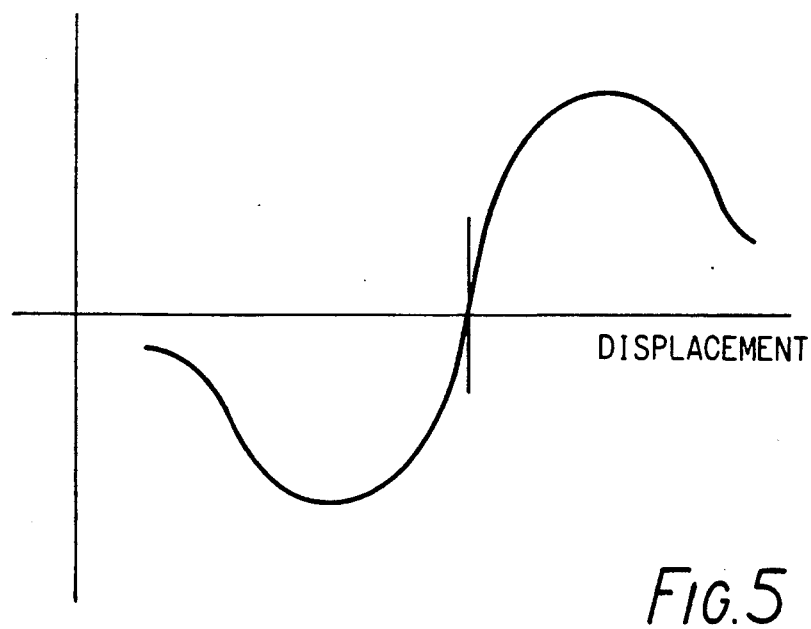
FIG. 5 is a graph showing the variation of the net signal derived from the optical probe with the displacement of the read head.

Referring to FIG. 4, the probe 60 comprises three optical fibres 64, 66, 68 arranged in triangular formation, with their ends flush. The fibres 64 and 66 have their optical axes 64' and 66' located on the circumference of a circle having the axis of the torsion bar at its centre. The optical axis 68' of the optical fibre 68 lies between the axes 66' and 64', and is offset radially.

The remote end of the optical fibre 68 is connected to a light source (not shown), and the remote ends of the optical fibres 64 and 66 are connected to respective photosensitive detectors (not shown). The outputs from the photosensitive detectors are connected to a difference circuit (not shown). The output from the difference circuit is zero when the photosensitive detectors receive equal intensities of light.

The optical reference mark 62 is provided by a line 70 of reflective chrome on a glass plate 72. The width of the line 70 is dependent on the dimensions of the optical probe 60, as explained below.

Referring to FIGS. 1 and 4, in use during the oscillatory scanning movement of the head 30, the optical mark 62 moves in sympathy back and forth under the probe 60. The output from the difference circuit will be dependent on the displacement of the head 30 from the reference position, and is shown in figure. When the read head 30 is near the reference position, the probe 60 is directly over the reflective line 70. Light from the optical fibre 68 illuminates the line 70, and is reflected back down the fibres 64 and 66.

In the reference position, equal intensities of light are reflected back down the fibres 64 and 66, so that the output from the difference circuit is zero. The signals from the photosensitive detectors will only be equal when both fibres are equally over the reference mark. This point will be unique, provided that the width of the reference line 64 is less than the distance between the outermost points of the light transmissive portions of the optical fibres, 62 and 64, as shown by the dimension "E" in FIG. 4.

When the head 30 is close to the reference position, light is reflected back from the line 70, but the intensities of the light reflected down each of the fibres 64 and 66 are unequal, and depend on which side of the reference position the head is at that moment. Since the outputs from the photosensitive detectors will therefore be unequal, the output from the difference circuit will be non-zero, and its sign, either positive or negative, will depend on which side of the reference position the head is at that moment.

When the head 30 is not near the reference position, a small amount of light is always reflected back down at least one of the fibres 64 and 66, and the output signals from the photosensitive detectors are small, but different. The difference signal is also small, but not zero.

Therefore each time the read head approaches the reference position from one side during its oscillatory movement, the output from the difference circuit rises gradually from a small positive value until it reaches a maximum positive value. As the head passes through the reference position, the output signal will drop through zero. As the read head moves away from the reference position, the output signal will reach a minimum negative value before gradually rising to a small negative value.

Each time the head passes through the reference position in the opposite direction, the output signal will be the same as that described above, but inverted.

Figure 6:
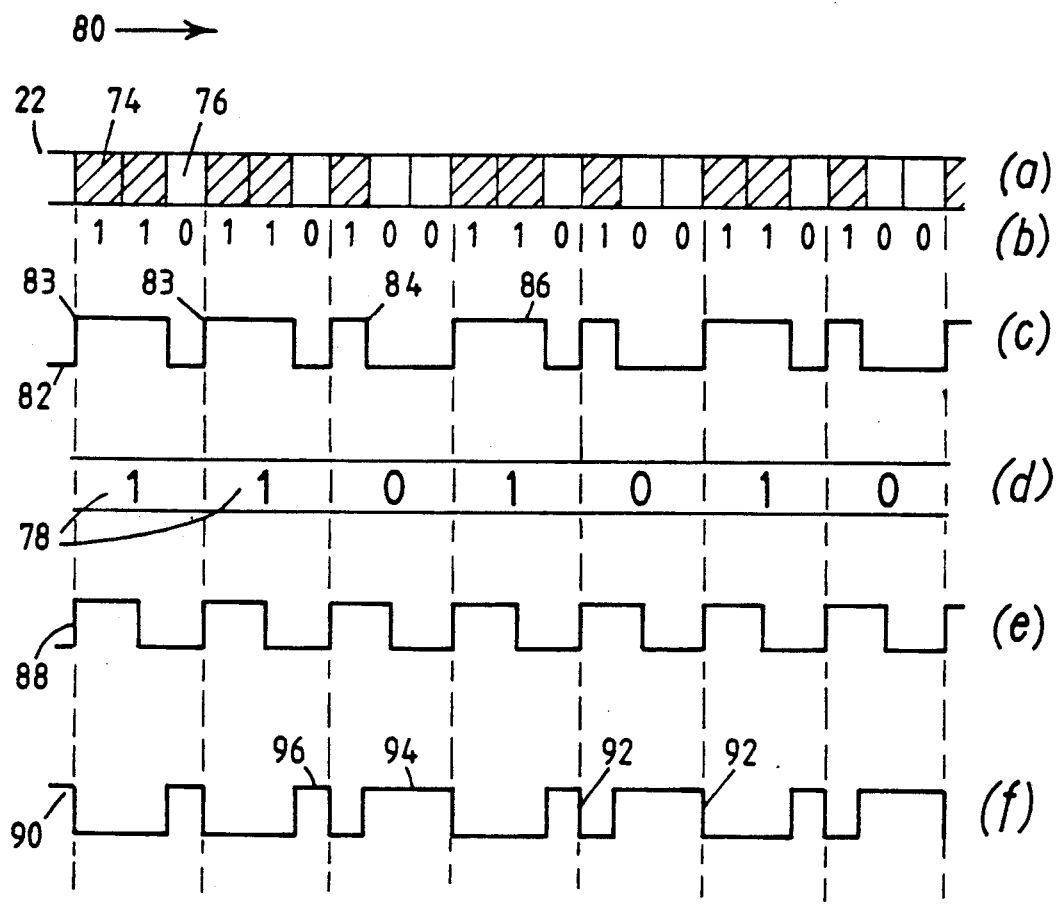
FIGS. 6a-f shows how the code is represented on the disc of the angular displacement transducer with associated waveforms.

Referring to FIGS. 6 and 6b, the binary data code is represented on the track 22 as a sequence of binary features. The features appear as areas 74 of reflective material denoting a logical 1, and areas 76 of non reflective material denoting a logical 0.

Referring to FIGS. 6b and 6d, each bit 78 of data is represented as a sequence of three features, as follows:

data bit 1 = 110 binary features data bit 0 = 100 binary features

As the read head 30 scans an area of the track, it will read sequentially the features in that area. Say, for example, that during a portion of the scan, the head 30 reads the sequence of features shown in FIG. 6a, in the forward direction as shown by the arrow 80. The output 82 of the read head 30 is shown in FIG. 6c. The output is a continuous stream of pulses representing the features read.

By representing the data bits by the features as described above, the first feature read for each data bit is a logical 1, and the last feature read for each data bit is a logical 0. This enables the individual output stream to be split into data bit frames containing the the 3 features for the data bit, since each data bit frame begins with a rising edge 83 of a high pulse.

The middle feature corresponds to the data bit being represented. Thus a short high pulse 84 corresponds to a logical 0 data bit, and a longer high pulse 86 corresponds to a logical 1 data bit.

Referring to FIGS. 6c and 6e, the regular occurrence of a rising edge 83 of a pulse enables a clock signal 88 to be derived from the output 82 of the head 30. The clock signal 88 can be used by the transducer circuitry for timing purposes to decide whether a data pulse is a long data pulse 86 representing a logical 1, or a short data pulse 84 representing a logical 0.

The above description of how the code on the track 22 is read, applies when the head is moving in the forward scan direction. However, the code is also read during the return, or reverse, direction of scan, when the read head is moving in the opposite direction to the arrow 80.

During a reverse scan, the output 82 from the read head 30 is inverted, by an inverter (not shown) forming the signal 90 in FIG. 6f. The signal 90 has similar properties to the signal 82, in that (viewed from right to left) the bits of data code are represented by data pulses beginning with a regular rising edge 92 from which a clock pulse can be derived. The lengths of the pulses correspond to whether the data bit is a logical 1 or 0, but since the signal has been inverted, a long pulse 94 corresponds to a logical 0, and a short pulse 96 corresponds to a logical 1. The bit order moreover must be reversed.

If the disc 20 is itself rotating, the number of bits of the code on the track 22 read when the head 30 is moving in the opposite direction to the direction of rotation will be greater than when the disc is stationary. Similarly the number of bits of code read when the head is moving in the same direction as that of rotation will be less than when the disc is stationary. If the rotational speed of the disc becomes sufficiently high that not enough bits of data are read during the scan in the direction of disc rotation, the reading is distarded, and only the reading taken in the opposite direction is used.

Figure 7:
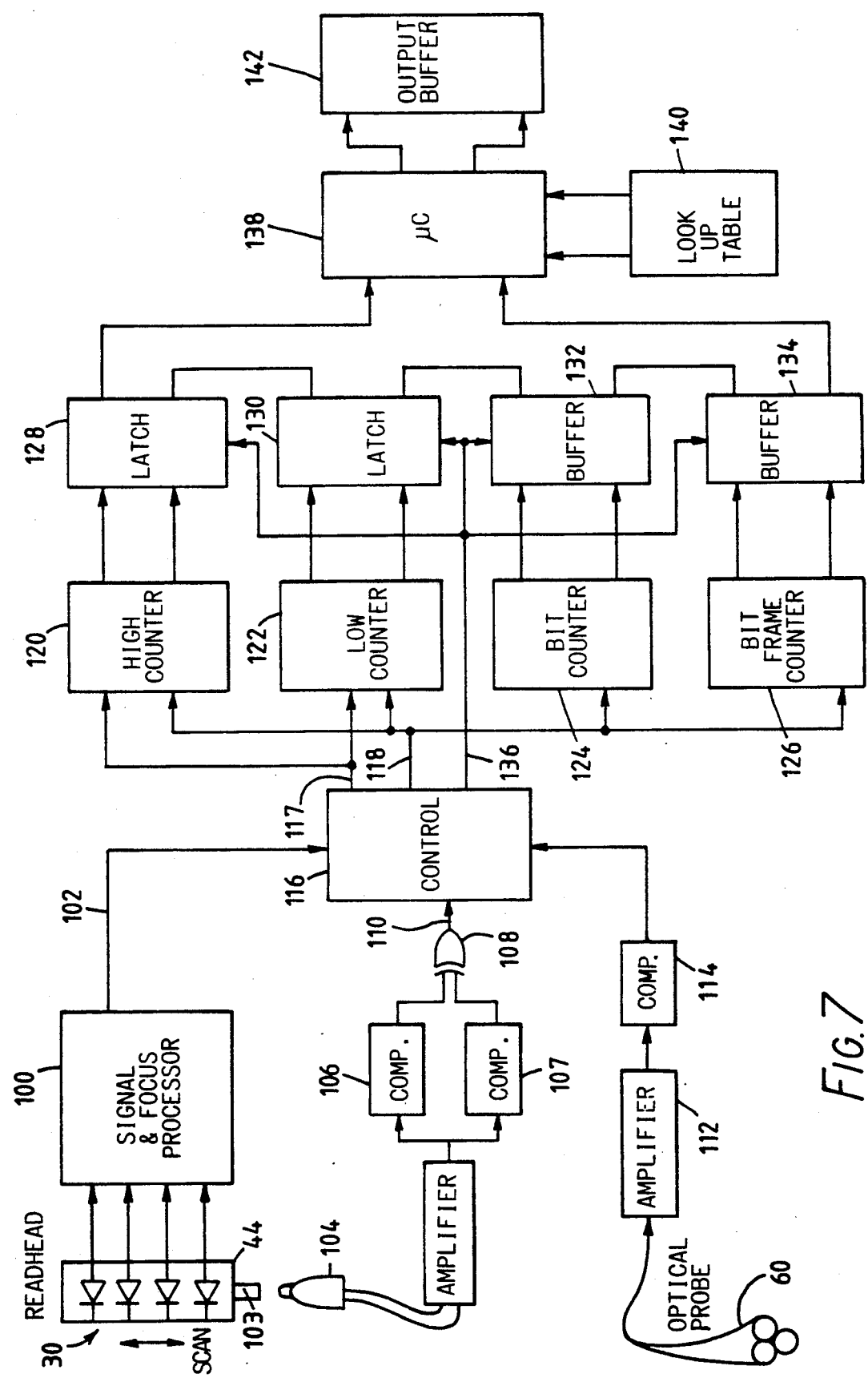
FIG. 7 is a block diagram showing the complete circuit for determining the angular displacement in the angular displacement transducer.

FIG. 7 is a block diagram showing the parts of the transducer, and how they are interconnected. The outputs from the four quadrant photodiode 44 are connected to a signal and focus processor 100, which performs the autofocus operation described hereinbefore. The processor 100 also has an output 102 that corresponds to the overall net signal read by the read head 30.

Figure 9:
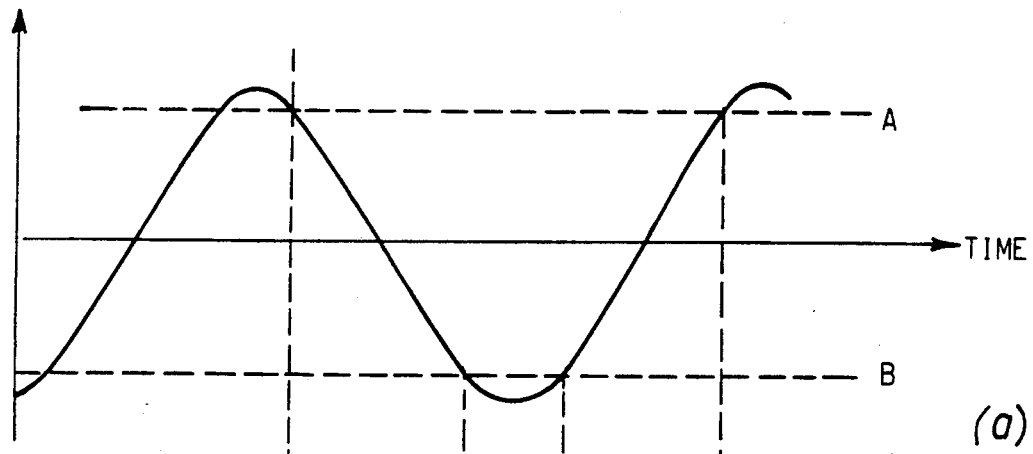
FIGS. 9a-b is a series of graphs showing the variation of the displacement of the read head in time, and the waveforms of the end point detector.
Figure 9:
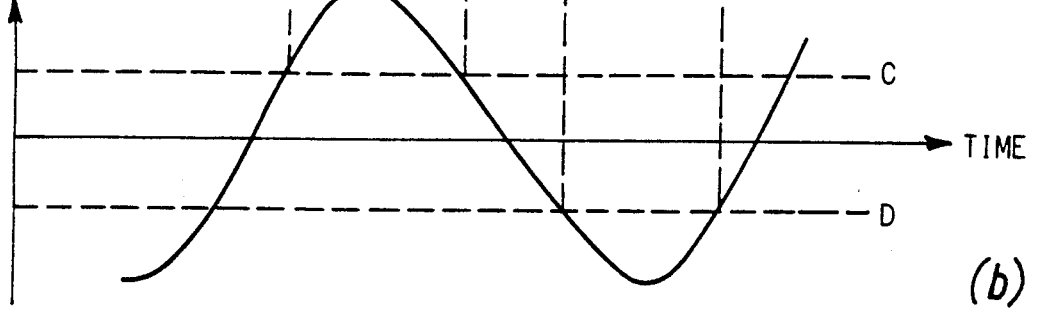

The arrangement includes the magnetic first sensor 104 and the magnet 103, for detecting the end points of the approximately linear portion of head scan and the direction of the movement of the head during its oscillatory scan. The output from the magnetic sensor 104 is passed through comparators 106 and 107 connected in parallel. The output from the comparators are passed to an exclusive or logic gate 108, providing a net output 110. Referring to FIGS. 7 and 9 one comparator provides a true output when the signal above the threshold 'C', the other when the signal is below the threshold 'D'. The logic gate 108 provides a large (true) output only when one comparator output is true and the other is false, i.e. when the signal (FIGS. 9b,9c) is between the thresholds.

The arrangement also includes the optical probe 60 described hereinbefore. The outputs from the photo sensitive detectors are connected to the difference amplifier 112, whose output is then passed to a comparator 114, giving a true output signal when the head is in the reference position.

The output from the comparator 114, and the outputs 102 and 110 are each connected to a control circuit 116, which determines from the sensor outputs, the direction of scan during the oscillatory movement, the end points of the linear scan portions, and the instant that the read head 30 is in the reference position.

The control circuit 116 has control lines 117 and 118 for controlling four counters arranged in parallel.

The first counter 120 times the period of the duration of a data pulse when read by the read head 30. The second counter 122 times the subsequent period when no data pulse is being read. The third counter 124 counts the number of pulses read by the head during the portion of the scan after the detection of the reference position. The fourth counter 126 times the period from the detection of the reference position in a data bit frame to the end of the data bit frame in which the reference position occurred.

The output from the first counter 120 is connected to a latch 128, and the output from the second counter 122 is connected to a latch 130. The output from the third counter 124 is connected to a buffer 132, and the output from the fourth counter 126 is connected to a buffer 134. The latches 128 and 130, and the buffers 132 and 134 are controlled by a control line 136 from the control circuit 116.

Under the control of the control circuit 116, the latches 128 and 130, and the buffers 132 and 134 interface with a microcomputer 138 which interprets the data pulses as the data code, and refers to a look up table 140 to obtain the angular position corresponding to the data code. The angular position is output by means of an output buffer 142, to enable the transducer to be connected to external measurement and monitoring apparatus.

In use, when the read head is at an end point of a scan, and is about to begin a scan, the control circuit sends a signal via the control line 118 to reset the counters 120, 122, 124 and 128.

As the scan begins, the first data pulse appears at the output 102 of the read head.

The first counter 120 times the length of the data pulse, and the second counter then times the subsequent period until the next data pulse appears. The final values of the first and second counters 120 and 122 are stored in the latches 128, 130 respectively, and are transferred to the microcomputer 138 on the production of an interrupt signal by the control circuit 116 when the next data pulse appears at the output 102. The microcomputer 138 determines from the measured relative time period of the pulse and the subsequent time period until the next pulse, the value of the data bit in the pulse. If the period of the pulse is greater than the subsequent period to the next pulse, the data bit is a logical 1, otherwise the data bit is a logical 0.

When the read head reaches the reference position during its scan, the control circuit 116 sends a signal to start the third and fourth counters 124, 126. At the end of the scan, the values in the buffers are passed to the microcomputer 138 for processing. The value in the buffer 132 corresponds to the position in the scan of the data bit frame during which the reference position was detected. This enables the microcomputer to align the data bits so that the correct 15 bits of data are selected for the angular position determination.

The value in the buffer 134 corresponds to the time period between the instant that the reference position was detected and the end of the data bit frame during which the reference position was detected. This is used by the microcomputer 138 in an interpolation method, described below, for improving the resolution of the angular position determination.

When the head 30 reaches the end of the scan, the control circuit 116 sends reset pulses to the counters 120, 122, 124 and 126 and to the microcomputer 138. During the scan the microcomputer will have received approximately 19 bits of coded data but the correct 15 bits are selected for the angular position determination according to the accurance of the reference position. The microcomputer 138 accesses the look-up table 140 to obtain the angular position corresponding to the code read from the disc.

Figure 8:
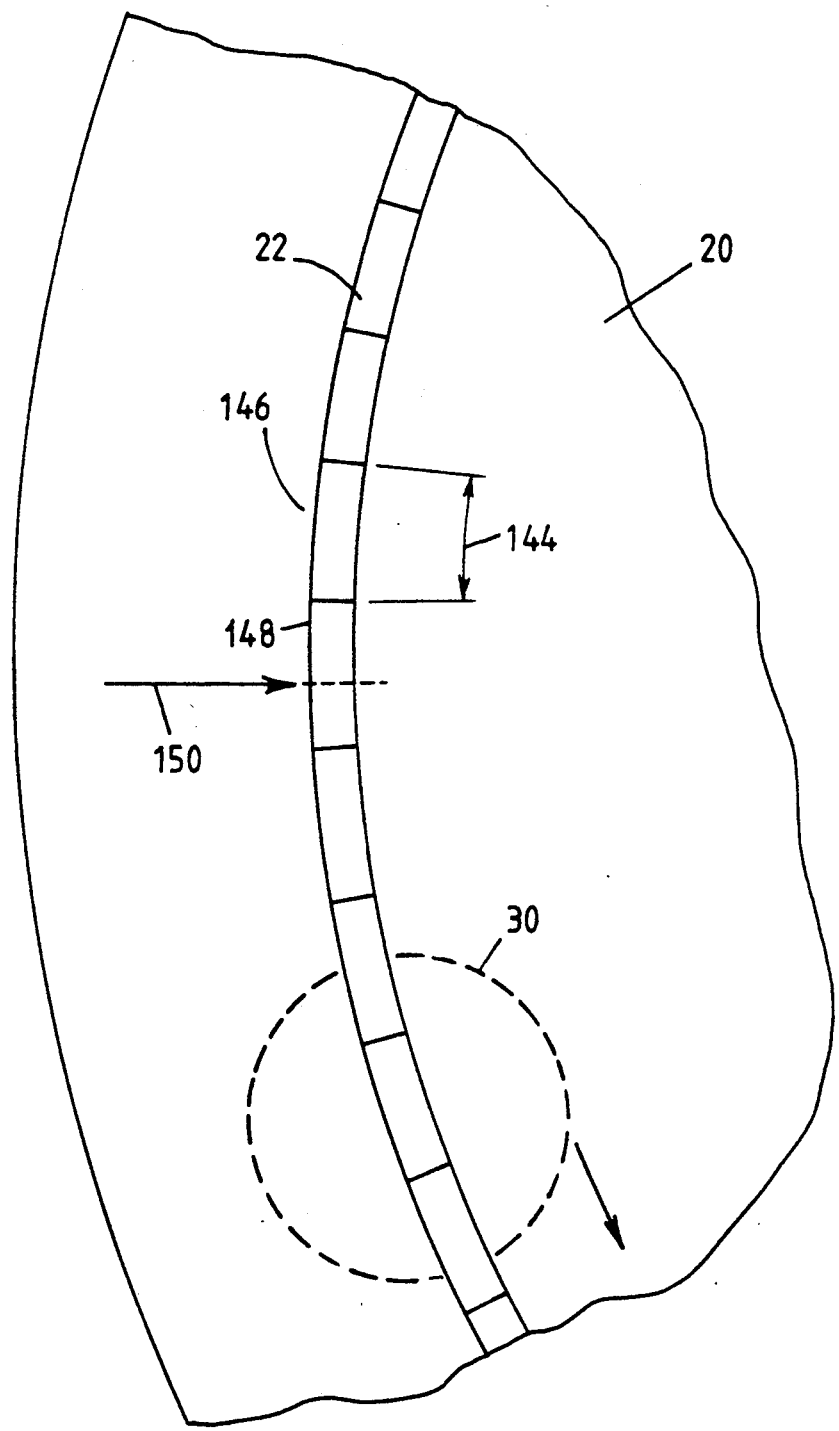
FIG. 8 is a diagrammatic view of coded data read from the track on the disc.

Referring to FIG. 8, the angular positions determinable by the transducer are quantised in angular values having a step width equal to the angular width 144 of each coded data bit 146 (3 features) on the track 22. Reading the code itself cannot provide an angular position to an accuracy corresponding to less than the angular width of the coded data pulse.

A method of interpolation is used to improve the resolution. The method exploits the accurate nature of the reference position detector. The position of the reference position in the scan is denoted by the arrow 150.

After a scan has been completed, the buffer 132 will contain the value corresponding to the position in the scan of the coded data bit 148 during the reading of which the reference position was detected. The buffer 134 will contain a valve corresponding to the time period between the instant that the reference position was detected and the end of the data bit 148 during which the detection occurred. The latches 128 and 130 will contain valves corresponding to the overall time period taken to read the coded data bit 148.

The microcomputer 138 compares the ratios of these time periods and derives a displacement value corresponding the displacement of the data bit 148 relative to the reference position 150. This displacement valve is combined with the angular position determined from the look up table to increase the resolution of the angular position signal. The improvement in the resolution will be dependent on how accurately the relative time periods described above can be measured, and will therefore be dependent on the frequency of the clock signal supplied to the counters 120, 122 and 126. For example, if the clock signal has 16 counts per data bit period, the position of the reference mark will be determined to one eighth of a coded data bit, giving an effective resolution three bits better than the coded data on the track 22.

In an alternative embodiment the two reference sensors 103, 104 and 60, 62 are replaced by a linear variable differential transformer displacement sensor, having a magnetic core movable axially within the coils of a differential transformer. The movable core is connected to the counterweight 39 on the support assembly 32, and projects therefrom in the scan direction. The body of the sensor containing the coils is fixed to the housing. Scanning causes the core to reciprocate within the coils, producing an alternating output signal representative of the scan. The output signal is sufficiently accurate to define both the linear portion of the scan and the centre of the linear portion. Comparators are chosen to detect these positions, and to provide outputs for connection to the countrol circuit 116. As in the previous embodiment, the output from the position sensor is amplified, and applied in a positive feedback manner to the scanning drive magnetic coils, to maintain resonant oscillation of the support assembly and the torsion bar.

It will be appreciated that with the embodiment described above, adequate resolution of the angular position can be obtained, even though the read head can itself only read one feature of the code on the disc at any one moment. The use of a simple read head reduces the cost of the transducer compared to the cost of equivalent transducers using more complicated read heads.

It will be appreciated that in the embodiments described above, the read head, its support assembly, the coded disc, and the control devices for controlling movement of the read head, are all similar to corresponding devices used in a conventional compact disc reading mechanism. The embodiment can use a conventional compact disc reading mechanism, only minor modification being required.

It will be appreciated that although in the embodiment described above, only one read head is used, in an alternative embodiment, two or more read heads could be used. If two read heads were used, they could be mounted on the same support assembly, and arranged to scan two separate regions of the track. The transducer would then require a second circuit to control the autofocusing of the read head, and to interpret the coded data bits read from the track by the second read head. The two results could be combined to improve further the resolution of the angular position determination.

By using two read heads, any problems encountered from misalignment between the support assembly and the disc could be overcome. If manufacturing tolerances make one head become more misaligned, they could be arranged to make the other head become more aligned. Only the output from the better aligned head would then be used.

It would also be possible to have more than one head reading more than one track and still obtain considerable advantage over apparatus requiring as many heads as there are bits in a code word.

We claim:

1. Apparatus for determining the position of a first member movable relative to a second member, comprising a coded track on the first member and extending in the direction of the relative movement, a photosensitive read head mounted on the second member, means for oscillating the read head to scan over and read a limited region of the coded track, and means for interpreting the code read by the read head as the position.

2. Apparatus according to claim 1, wherein the position is an angular position, and the first member is a rotatable disc, the coded track being formed as a circle on the disc.

3. Apparatus according to claim 1, wherein the code is a binary data code.

4. Apparatus according to claim 3, wherein the binary data code is arranged sequentially along the track.

5. Apparatus according to claim 4, wherein each bit of the data code is represented on the track as a sequence of binary features, namely a first feature corresponding to a logical 1, a second feature corresponding to the data bit, and a third feature corresponding to a logical 0.

6. Apparatus according to claim 3, wherein the binary data code is a continuous pseudo random code having the property that any selected group of N adjacent bits of the code is not repeated in any other group of N adjacent bits, N being a positive integer and the amplitude of the oscillation being sufficient to scan a region encompassing at least N bits.

7. Apparatus according to claim 1, wherein the code is read sequentially in both directions of travel of the oscillating read head.

8. Apparatus according to claim 7, further comprising means for selectively inverting the output signal from the read head whereby, for one direction of scan the output signal is not inverted and, for the other direction of scan the output signal is inverted.

9. Apparatus according to claim 1, in which the first member is moving relative to the second member, further comprising means for controlling the interpreting means such that the code is only interpreted from the track during a scan in the opposite direction to the direction of movement of the first member relative to the second member.

10. Apparatus according to claim 9, wherein the means for controlling the interpreting means are responsive to the speed of movement of the first member to cause the code to be interpreted only during a scan in the said opposite direction only when the speed of movement exceeds a predetermined level.

11. Apparatus according to claim 1, wherein the means for oscillating the read head comprises a magnet and a coil, the coil being excited electrically to attract and repel the magnet.

12. Apparatus according to claim 1, wherein the read head is mounted on an assembly supported by means of a torsion bar.

13. Apparatus according to claim 12, wherein the read head is movably oscillated at the resonant frequency of the torsion bar.

14. Apparatus according to claim 13, wherein the resonant frequency is in the range of 50 Hz to 250 Hz.

15. Apparatus according to claim 1, further comprising means for detecting the end points of travel of the oscillatory movement of the read head.

16. Apparatus according to claim 15, wherein the read head is movably oscillated at the resonant frequency of the torsion bar, and the output from the detecting means is applied in a positive feedback manner to the means for oscillating the read head, to maintain resonant oscillation.

17. Apparatus according to claim 15, wherein the detecting means comprise a magnet attached to the read head assembly, and a magnetic pick up mounted on the second member.

18. Apparatus according to claim 15, wherein the detecting means comprise a linear variable differential transformer displacement sensor having a core axially movable in the direction of scan within the coils of a differential transformer.

19. Apparatus according to claim 1, further comprising means for detecting when the read head is in a predetermined reference position relative to the second member, whereby the code read on either side of the reference position can be aligned to ensure that it corresponds to a reading at the reference position.

20. Apparatus according to claim 19, wherein the reference position detecting means comprise an optical detector and an optical reference mark, mounted on the read head assembly and the other on the second member.

21. Apparatus according to claim 19, wherein the optical detector comprises a first optical fibre for delivering light from a source to illuminate the reference mark, and second and third optical fibres for receiving light reflected back from the reference mark and delivering the light to respective light detectors, the second and third optical fibres being positioned on either side of the first optical fibre, the arrangement being such that, in use during the oscillatory movement of the read head assembly, when the reference mark is in the reference position, light is reflected equally down the second and third optical fibres, when the reference mark is offset to one side of the reference position, light is reflected mostly down the second optical fibre, when the reference mark is offset to the other side of the reference position, light is reflected mostly down the third optical fibre.

22. Apparatus according to claim 21, further comprising an electronic circuit for obtaining a signal corresponding to the difference between the outputs of the light detectors, such that in the reference position the difference signal is zero.

23. Apparatus according to claim 20, wherein the optical reference mark is a chrome line formed on glass, the width of the line being less than the distance between outermost parts of the light transmissive cores of the second and third optical fibres.

24. Apparatus according to claim 1, in which the code on the track consists of binary features, further comprising means for determining the relative positions of the reference position and the beginning and end of the coded data bit during which the reference position is detected, the means comprising a first timer for timing the period between the instant that the reference position is detected and the end of the coded data bit during which the detection occurs, and a second timer for timing the period between the instants that the beginning and end of the coded data bit are read by the read head.

* * * * *